United States Patent
Rebstock

(10) Patent No.: US 9,633,881 B2
(45) Date of Patent: Apr. 25, 2017

(54) AUTOMATIC HANDLING BUFFER FOR BARE STOCKER

(75) Inventor: Lutz Rebstock, Gaeinhofen (DE)

(73) Assignee: Brooks Automation, Inc., Chelmsford, MA (US)

( * ) Notice: Subject to any disclaimer, the term of this patent is extended or adjusted under 35 U.S.C. 154(b) by 1128 days.

(21) Appl. No.: 12/025,752

(22) Filed: Feb. 5, 2008

(65) Prior Publication Data

US 2009/0196715 A1 Aug. 6, 2009

(51) Int. Cl.
*H01L 21/677* (2006.01)
*H01L 21/67* (2006.01)

(52) U.S. Cl.
CPC .. *H01L 21/67769* (2013.01); *H01L 21/67276* (2013.01)

(58) Field of Classification Search
USPC .................................................. 414/937, 217
See application file for complete search history.

(56) References Cited

U.S. PATENT DOCUMENTS

| | | | |
|---|---|---|---|
| 5,980,183 A | 11/1999 | Fosnight | |
| 6,079,927 A * | 6/2000 | Muka | 414/217 |
| 6,336,546 B1 * | 1/2002 | Lorenz | 198/346.2 |
| 6,468,021 B1 | 10/2002 | Bonora et al. | |
| 6,579,052 B1 | 6/2003 | Bonora et al. | |
| 6,604,624 B2 * | 8/2003 | Hirata et al. | 198/494 |
| 6,848,876 B2 * | 2/2005 | Babbs et al. | 414/217.1 |
| 7,101,138 B2 | 9/2006 | Fosnight | |
| 7,134,825 B1 * | 11/2006 | Schmutz et al. | 414/217.1 |
| 2003/0091410 A1 | 5/2003 | Larson et al. | |
| 2004/0062627 A1 * | 4/2004 | Aggarwal et al. | 414/217 |
| 2004/0126208 A1 * | 7/2004 | Tawyer et al. | 414/222.02 |
| 2007/0010909 A1 | 1/2007 | Bonora et al. | |
| 2007/0134078 A1 | 6/2007 | Rogers et al. | |
| 2007/0264114 A1 | 11/2007 | Ma et al. | |
| 2008/0023417 A1 * | 1/2008 | Yamamoto | 211/41.18 |

* cited by examiner

*Primary Examiner* — Jonathan Snelting
(74) *Attorney, Agent, or Firm* — Perman & Green, LLP; Colin C. Durham

(57) ABSTRACT

A buffer station for automatic material handling system can provide throughput improvement. Further, by storing to-be-accessed workpieces in the buffer stations of an equipment, the operation of the facility is not interrupted when the equipment is down. The buffer station can be incorporated in a stocker, such as bare wafer stocker.

20 Claims, 14 Drawing Sheets

AUTOMATIC HANDLING BUFFER FOR BARE STOCKER

FIELD OF THE INVENTION

The present invention relates to apparatuses and methods to store and transfer objects, and more particularly to workpiece stocker configurations such as stocker for semiconductor wafers, reticles or carrier boxes.

BACKGROUND

In the process of manufacturing semiconductor devices, LCD panels, and others, there are hundreds of processing equipments and thus hundreds of manufacturing steps. It is very difficult for the flow of the wafers, flat panels, or LCDs (hereafter workpiece) to be uniform from step to step, from tool to tool. Despite the best planners, there is always the unexpected scenario, such as a tool down, an emergency lot coming through, a periodic maintenance lasting longer than planned, thus there are various accumulations of the workpieces at certain steps for certain tools. The accumulated workpieces will need to be stored in a storage stocker, waiting to be processed.

In a typical bare stocker system, a robot is typically used to remove the workpieces from the carrier boxes, and then loaded into a storage chamber, where the workpieces are stored without the original carrier boxes. For box stocker system, the workpieces are stored together with the carrier boxes, without the need for removing them out of the carrier boxes.

The carrier box is a protective container to minimize the substrate exposure to the environment outside of the processing machines and protect the substrate against particulate contamination. The carrier boxes are handled by an operator or by an automatic material handling system such as automatically guided or overhead transport vehicles that travel on predetermined routes, either on the ground or suspended on ceiling tracks. For semiconductor wafers, the carrier boxes are normally cassettes pods, such as SMIF (standard machine interface) or FOUP (front opening unified pod), which are handled by an operator at the tools equipment front end module (EFEM) or automatically picked up and placed in the automatic transport system.

One type of conventional transport system is an overhead transport (OHT) system, which comprises an OHT vehicle, which runs freely on a rail mounted on a ceiling. The OHT vehicle carries a cassette pod between facility equipment, such as processing systems and stockers. The OHT vehicle can load or unload a cassette pod onto a load port of the equipment, for example a MLP (Mobile Launch Platform) or an EFEM. From there, the cassette pod or the wafers can be transferred from or to the inside of the equipment.

SUMMARY

Methods and apparatuses for improved equipment are disclosed. In exemplary embodiments, IO buffer for automatic material handling system is provided for improving the throughput of equipment, especially for bare wafer stockers. With the fast access time of automatic carrier transport, and the slow response of stocker storing bare wafers, the IO buffer can improve the throughput of the bare wafer stocker by pre-assembling the wafer carriers.

In an exemplary embodiment, the IO buffer station stores the workpiece to be needed in containers. Thus when recalled, the workpiece will be brought directly from the IO buffer station to the automatic carrier transport, instead of waiting for transferring to the container from the chamber. In an embodiment, the IO buffer operation is independent of the stocker, thus providing continuous flow of the facility even when the stocker is inoperative. Further, in exemplary embodiments, the invention comprises an algorithm or a controller for determining the sequence of the workpiece flow, for example, to anticipate or to know the workpieces to be brought to the buffer station. In a facility, such as a semiconductor fabrication facility, the workpiece flow can be imported to the controller as an input.

The present invention further discloses a scalable stocker configuration for storing workpieces in a fabrication facility, especially a wafer stocker or a reticle stocker for semiconductor processing. In an exemplary embodiment, the workpieces are stored in 2D linear array of shelves disposed on left and right walls of the storage area, together with a center linear robot handling assembly. In this configuration, the storage area can be extended toward the service area while keeping the same clean room front surface. The stocker configuration can also provide the storage of the workpieces in a highly dense configuration, in preferably vertical positions. The center linear robot includes a circumferential edge gripper handling assembly, approaching and picking up the workpieces from the circumferential edges.

BRIEF DESCRIPTIONS OF THE DRAWINGS

FIG. 1 shows an exemplary embodiment of the buffer and stocker according to the present invention.

FIG. 2 illustrate various preferred embodiments of the present buffer assembly. FIG. 2A illustrates a ceiling-based buffer assembly. FIG. 2B illustrates a floor-based buffer assembly. FIG. 2C illustrates a cross configuration where a ceiling-based buffer interfaces with a floor-based transport.

FIG. 3 illustrates another exemplary embodiment of the buffer assembly

FIG. 4 illustrate other exemplary embodiments of the buffer assembly. FIG. 4A illustrates two separate automatic transports, serviced by two buffer loading stations through two transfer mechanisms. FIG. 4B illustrates two separate automatic transports at opposite ends. FIG. 4C illustrates two buffer loading stations servicing the same automatic transport.

FIG. 5 illustrate exemplary embodiments of the present buffer assembly having a top buffer transport and a bottom buffer transport. FIG. 5A illustrates a mechanism to transfer containers between the top and bottom buffer loading stations. FIG. 5B illustrates an additional station to transfer container between the two buffer loading stations.

FIG. 6 illustrate the top view of various exemplary embodiments of the buffer assembly interfacing an automatic transport. FIG. 6A illustrates a plurality of buffer stations arranged in one row facing the automatic transport. FIG. 6B illustrates additional buffer stations arranged in an opposite and parallel row, sandwiching the transfer mechanism. FIG. 6C illustrates additional buffer loading stations interfacing the same transport.

FIG. 7 illustrates a top view of an exemplary buffer assembly having one row of buffer stations interfacing two automatic transports.

FIG. 8 illustrate top views of exemplary buffer assembly configurations where there are two transports, either intersecting each other or in parallel. FIG. 8A illustrates a buffer assembly configuration comprising two buffer loading stations located at the end of the buffer stations, together with two intersecting transports. FIG. 8B illustrates a buffer assembly configuration comprising four buffer loading stations located at two ends of the buffer stations, together with two parallel transports. FIG. 8C illustrates a buffer assembly configuration comprising three buffer loading stations located at two ends of the buffer stations, together with two intersecting transports.

DETAIL DESCRIPTIONS

Figure 1:
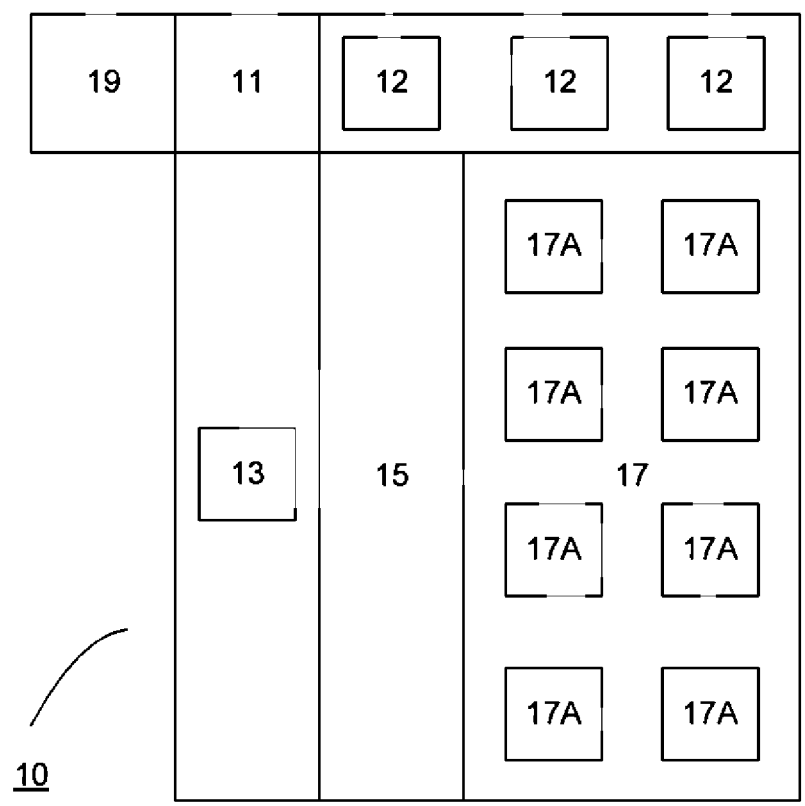

The present invention, in general, pertains to methods and apparatuses for an IO buffer assembly and a storage stocker system for a fabrication facility. According to an embodiment, an IO buffer for automatic material handling system is provided. The IO buffer can compensate for the speed of the equipment or stocker, especially when interfacing with the fast throughput of an automatic guidance system for wafer containers. The IO buffer is preferably associated with a process equipment, a metrology equipment, or a stocker, such as a wafer stocker, to facilitate the transfer of the wafers. According to still another embodiment, stocker management, methodology and apparatus for IO buffer are provided.

To accommodate the requirement of high throughput, an IO buffer assembly adjacent the IO loaders is included to store the ready carriers. Such IO buffers are generally configured adjacent the automatic material handling system, and include shelves for storing wafer carriers with a transport system for transferring the wafers carriers between the IO buffer and the automatic material handling system. In an aspect, the IO buffer comprises a 2D array of station, together with an XY linear guide robotic for transfer operation, preferably located at the top or bottom for automatic vehicle transport.

The IO buffer is preferably stored the containers to be needed next, and more preferably stored an adequate number of containers for a predetermined period so that the operation of the fabrication facility is not stopped or inconvenient during a general failure of the associated equipment. In another embodiment, the present invention discloses a storage system employing an IO buffer. The articles stored in the IO buffer are preferably stored in bare format, which needed to be transferred to a container before transporting to the next equipment.

The IO buffer is preferably independent from the stocker, so that even if the stocker experiences a failure, there are enough containers to service the facility during the repair of the stocker. The storage system can communicate with the fabrication facility to know what articles to be needed, immediately and in the near future. Thus the storage system can retrieve the articles from the storage area and store in the IO buffer. The communication equipment can be a controller or a computer system, managing the information retrieval and sequencer for the workpiece flow of a facility. The algorithm can determine the workpieces to be stored in the buffer stations, waiting to be accessed.

Exemplary embodiments of the present invention include a buffer assembly for automatic handling system in connection with a stocker in a fabrication facility such as semiconductor fabrication facility. In an aspect, the stocker stores substrates (such as wafers, LCDs, or reticles) in bare form, without a protective container. With the wafers stored in bare form, taking wafers in and out of the storage area would take longer than the access time of the automatic handling system, thus in exemplary embodiments, the present invention discloses a buffer assembly for the automatic handling system to improve the throughput.

In an embodiment, the IO buffer can be an independent system, to be mounted adjacent a process, metrology or stocker tool to provide automatic handling buffering for the tool. In another embodiment, the IO buffer system may be incorporated into a stocker capable of storing relatively large numbers of wafers in a scalable footprint. While the description of the invention includes FOUP pods, other types of containers can be used, for example, SMIF pods, pods of various sizes, bottom opening pods, front opening pods, cassetteless pods, and open cassettes. Additionally, the term substrate or wafer can mean workpiece other than semiconductor wafers, such as reticles, flat panel displays, and other substrates which may be stored and/or transported within pods and cassettes.

Exemplary embodiments of the present invention include a stocker comprising a storage area, which preferably storing bare wafers. The stocker further comprises a stocker loading station to transfer wafers from a container to the storage area. The stocker also comprises an automatic handling station, such as an OHT loading station, for transferring the container to the OHT track. In an aspect, the stocker loading station can perform the function of the OHT loading station. In another aspect, there are a separate stocker loading station for interfacing with the stocker, and an OHT loading station for interfacing with OHT track. There can also be transfer mechanism for moving containers between the stocker loading station and the OHT loading station.

The present stocker can minimize the wait time by providing an OHT buffer, which provides input and output OHT buffering capability, either servicing a ceiling-based conveyor or a floor-based conveyor. In one embodiment, the stocker includes a ceiling-based OHT buffer adjacent the ceiling-based conveyor. The OHT buffer may, for example, store multiple containers, allowing fast throughput to the OHT regardless of the speed of the stocker. In another embodiment, the ceiling-based OHT buffer can service interbay and intrabay conveyor systems. In another embodiment, the buffer is located near the floor for interfacing with a floor-based conveyor for moving containers out of the stocker's container storage area and onto the facility floor-based conveyor. In another embodiment, the buffer is located near the ceiling for interfacing with a ceiling-based conveyor to move containers in or out of the stocker's storage area. In one embodiment, the input-output buffer may store multiple containers. The buffer is random access, thus supports the delivery of different priority containers.

The present stocker is also described in conjunction with OHT tracks or conveyors, but may also operate with other automatic material transport systems such as an overhead shuttle (OHS), a rail guided vehicle (RGV), an automated guided vehicle (AGV). For description purposes, "ceiling-based" means any height above the container loading height of a load port, and "floor-based" below the container loading height of a load port, including under the facility floor.

FIG. 1 illustrates an exemplary stocker according to the present invention. The stocker 10 comprises a storage area 17 for storing wafers, preferably in bare form. The storage area 17 typically comprises shelves and compartments 17A for stacking wafers. The storage area 17 also can comprise an inner robotic mechanism (not shown) for transfer wafers in and out of the storage area.

The inner robotic mechanism can move vertically and horizontally to access walls of storage shelves positioned within the stocker (e.g., a container storage area). Such a robotic mechanism is well known in the semiconductor industry and therefore, a further description of the robotic mechanism is not necessary. Generally, it would take some time for the containers to be loaded or unloaded to the stocker storage, thus the OHT buffer can reduce the waiting time at the conveyor, leading to high throughput.

Interfacing the storage area 17 is a loading station 13 for inputting or outputting wafer containers, and a robotic transfer 15 for transferring wafers from the loading station 13 to the storage area 17. The loading station can comprise an EFEM station for handling wafer containers such as FOUP or SMIF. The loading station can be handled by an operator, thus providing manual handling of the wafer containers. In manual mode, the wafer containers can be carried by an operator, loading into the loading station 13 to receive wafers from the stocker storage area, or to place wafers from the containers to the storage area. The loading station can comprise an automatic loading station, such as a MLP (Mobile Launch Platform), designed for accepting containers from an automatic handling system, such as OHT track. The loading station can comprise a manual EFEM loading station and an OHT loading station, together with a transfer mechanism between these stations. In an aspect, the EFEM station interfaces with the storage area, and the OHT loading station interfaces with the OHT track. After receiving the container from the OHT track, the transfer mechanism then transfers the container from the OHT loading station to the EFEM station, where the wafers can be loaded into the storage area. In an embodiment, there is one OHT loading station (since automatic loading can be fast) and a plurality of EFEM loading stations (since manual loading can be slower). Both OHT loading station and EFEM loading station can receive containers from operator, where the OHT loading station can transfer the container to either the EFEM or the OHT station 11 to transfer to the OHT track, and the EFEM station can transfer wafers to or from the storage area of the stocker, or to the OHT loading station.

In exemplary embodiments, the wafers are stored vertically in the storage area, while being stored horizontally in the containers. The exemplary stocker can comprise robotic mechanisms and loading stations to accommodate the change in direction. For example, the robotic transfer 15 receives the wafers in horizontal direction from the container in the loading station 13, and places the wafer into a drop station (not shown) preferably within the storage area 17. The drop station can be adapted for holding a substrate, which can be picked up from the bottom or from the edges. For example, a horizontal substrate can be handled from the bottom side by a robot end effector and dropped to the drop station. An edge gripping robot arm can pick up the substrate from the edge and then transfer the substrate to a storage compartment in the vertical direction. Thus a drop station can accommodate a change in storage direction of the substrate, for example, from horizontal to vertical, or vice versa.

An inner robotic mechanism (not shown) in the storage area 17 then picks up the wafer and stores in vertical direction in the storage area. The wafers stored are also preferably stacked closely for higher storage capacity.

The stocker further comprises a plurality of buffer stations 12 which are interfacing with the automatic handling system such as the OHT vehicle and track 19. The buffer stations 12 are preferably connected to an OHT station 11 for receiving and placing container from and to the OHT track and vehicle 19. There can be multiple OHT tracks, thus exemplary embodiments of the present stocker comprise one or more of OHT stations to accommodate the OHT tracks. A transfer mechanism (not shown) transfers the container from or to the OHT track and vehicle 19 when reaching the OHT station 11. A buffer transfer mechanism can transfer the container from the OHT station 11 to and from the buffer stations 12. A transfer mechanism such as the MLP can also transfer the container from the OHT station to the loading station 13, for transferring wafers to the storage area 17.

A buffer transfer mechanism moves a container between the buffer stations and the OHT station 19 or the buffer loading station 11. A buffer transfer mechanism may comprise any mechanism that transfers a container. For example, any mechanism whereby the container is gripped, lifted, and moved. These movements may be accomplished by a single or multi-segmented arm, or by a linear slide. In addition, a separate mechanism could be used to lift the container from underneath.

Each buffer transfer mechanism is preferably located at the I/O end of the input-output buffer for transferring a container on or off the buffer stations. A buffer transfer mechanism can include feedback circuit such as sensors or position monitoring circuits. Another transfer mechanism can be used to transfer containers from the buffer loading station to the automatic transport. The transfer mechanism can include a director to rotate a container exiting the track or conveyor.

In exemplary embodiments, the storing sequence starts with the OHT vehicle carries a container on the OHT track to the OHT station 11. The transfer mechanism releases the container from the OHT vehicle and places the container onto the OHT station. If the stocker is busy, or otherwise not ready to receive the wafers, the container can be placed in the buffer area by the buffer transfer mechanism. When the stocker is ready, the container can be put back onto the OHT station. A transfer mechanism, such as the MLP and other transfer mechanism, transfers the container to a loading station such as the EFEM. From the EFEM, the wafers are retrieved and stored in the storage area 17. In an aspect, there is an additional drop station in the stocker where the wafers are dropped to the drop station before entering the storage area. The drop station can be used to change the direction of the wafer storage, for example, receiving the wafer in horizontal direction and placing the wafer in vertical direction. The wafer is retrieved from the EFEM by a transfer robot, which then places the wafer in the drop station. Another inner robot retrieves the wafer from the drop station and stores the wafer in the storage location. In an embodiment, the transfer robot is designed to accommodate the wafer in the EFEM, which is typically a robot to retrieve wafer in horizontal direction. The inner robot is designed to accommodate the wafer in the storage area, which is stored in vertical direction. The drop station is designed to accommodate both robots, accessed by horizontal and vertical directions.

Sequence for retrieval wafers is reverse. The wafers are retrieved from the storage area and loaded into the FOUP waiting in the EFEM. Optional drop station can be used, for example, to change directionality of the wafers. There can be a pre-aligner for aligning the wafer, or the drop station can act as an aligner. The FOUP container is transfer to the OHT station, for example, by a transfer mechanism to move the container to a MLP, and then to the OHT station. If the OHT vehicle is ready, the container can be transferred directly to the OHT track and moves to the required equipment. If the OHT is not ready, or the stocker is looking ahead, the container is stored in the buffer by the buffer robotic mechanism. When the OHT is ready, the buffer robotic mechanism transfers the container back to the OHT station to be loaded to the OHT vehicle.

The stocker can include a vertical module, such as a MLP for transporting containers. After a container is placed on the vertical module, the container may be transferred to the EFEM, or be sent into the OHT buffer loading station. From the OHT loading station, the containers can be sent to the automatic transport or to the buffer stations, one or more at a time in any order.

The buffer area can be located on top, bottom, left, right, front or back of the stocker. The buffer area can be a linear array distributed within one side surface of the stocker, such as the top side, the bottom side, the front side, the back side, the left side or the right side. The buffer array can be one layer or multiple layers. The number of buffer stations depends on the demand and the throughput of the stocker. If there is high demand for a slow throughput stocker, the number of buffer stations can be high to accommodate the situation.

In an aspect, the buffer area is located in the top area of the stocker. This location can accommodate the ceiling-based automatic handling system such as OHT track. In another aspect, the buffer area is located in the bottom area of the stocker. This location can accommodate the floor-based automatic handling system. In other aspects, the buffer area can be located in other sides, though other optimizations might be needed. For example, the front side might already be used for EFEM and manual buffer, the back side might already be used for service door, the left or right sides might increase the width of the stocker.

The stocker can include a ceiling-based I/O conveyor buffer dedicated to ceiling-based conveyor transport. The ceiling-based I/O conveyor buffer is preferably located at the same height or elevation as the OHT conveyor. Locating the I/O conveyor buffer at substantially the same height as the conveyor can simplify the transfer of the containers. The stocker may include a floor-based I/O conveyor buffer. Operation of the floor-based I/O conveyor buffer is similar to that of the ceiling-based I/O conveyor buffer.

The transfer assembly includes a mechanism, such as a lift or a displacement assembly, for transferring a pod from the OHT system to a buffer station or a transport station (such as a MLP), or a load/unload station (such as an EFEM).

The buffer transfer mechanism can include an X movement mechanism and a Y movement mechanism. Since each pod often has a standard configuration, for example, a semiconductor transport pod having a handle on top, the robot includes a robot arm adapted to engage the pod. The robot arm engages the handle and transports the pod between an OHT buffer loading station, a buffer storage station, an OHT MLP station and an EFEM load/unload station. For example, the robot arm may be used to move a transport pod from a OHT system onto a OHT loader, from a OHT loader to a buffer storage location, from a buffer storage location to a OHT MLP, from a OHT MLP to a EFEM, and vice versa.

FIG. 2 illustrate various preferred embodiments of the present buffer assembly. The buffer assembly comprises a transport buffer which includes one or more buffer stations 101 for storing containers and a buffer loading station 104 adapted for holding a container. The buffer assembly also comprises a buffer transfer mechanism 202 to transfer a container between the buffer loading station 104 and the buffer station 101. The buffer assembly further comprises an interface mechanism 204 or 205 for transferring a container between a bare substrate stocker and the transport buffer. For example, interface mechanism 204 can transfer a container between the buffer loading station 104 and the stocker loading station 103, which is responsible for loading substrates to the storage area 102 of the stocker through a transfer mechanism 201. There can be other stages between the stocker loading station 103 and the storage area 102, for example, a drop station to change the directionality of the substrate before being stored in the storage area 102. Alternatively, interface mechanism 205 can transfer a container between the buffer stations 101 and the stocker loading station 103. Optionally, the buffer assembly comprises a mechanism 203 to transfer container from the buffer loading station 104 to the automatic transport 105, such as an OHT track or conveyor.

Figure 2A:
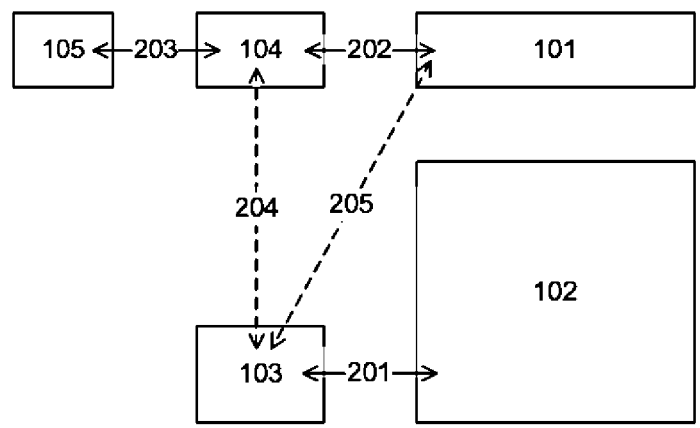
Figure 2B:
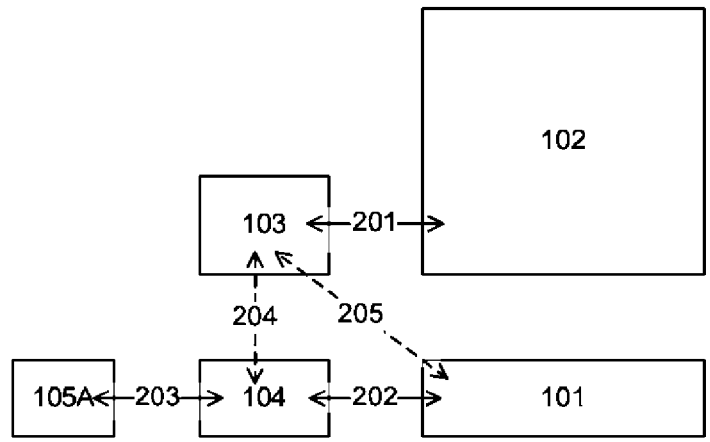
Figure 2C:
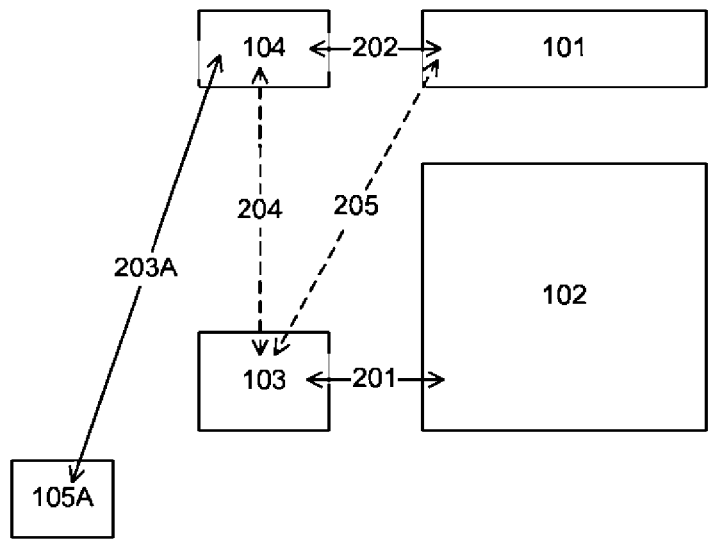

FIG. 2A illustrates a ceiling-based buffer assembly where the buffer station 101 is located on top of the stocker and the stocker storage area 102. The buffer loading station 104 is preferably located in the vicinity of the buffer station 101 for ease of container transfer. FIG. 2B illustrates a floor-based buffer assembly where the buffer station 101 is located at the bottom of the stocker and the stocker storage area 102, together with the buffer loading station 104. These configurations are well suited for a ceiling-based or floor-based automatic transport 105 and 105A, respectively, since the communication 203 can be short and direct. Other configurations can be implemented, based on the particular setup of the facility floor. For example, FIG. 2C illustrates a cross configuration where the ceiling-based buffer 101 interfaces with a floor-based transport 105A through mechanism 203A.

Figure 3:
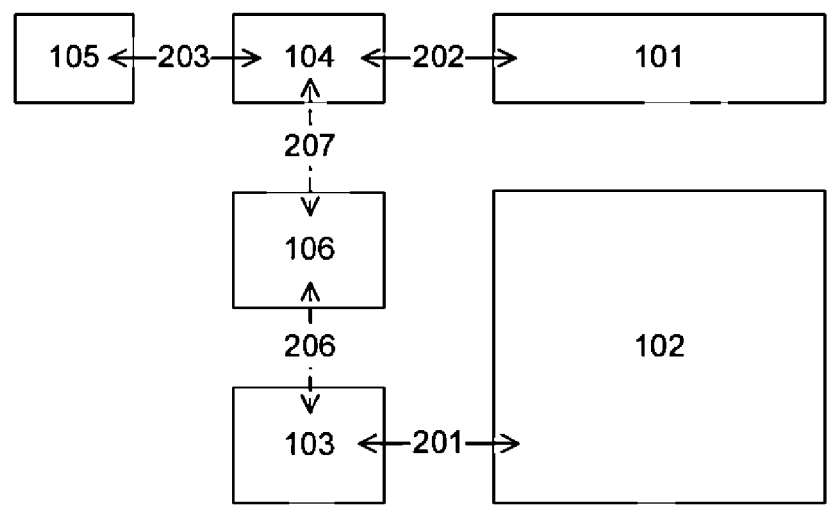

FIG. 3 illustrates another exemplary embodiment of the buffer assembly, comprising an additional station 106, interfacing the stocker such as the stocker loading station 103 and the transport buffer, such as the buffer loading station 104. The station 106 can be a MLP (mobile launch platform), designed for transfer container to the automatic transport 105. For example, an operator can load a container to the MLP, which is then transferred to the buffer loading station 104 through the mechanism 207. The mechanism 207 can be an elevator, elevating the container from the support platform of the MLP to the platform of the buffer loading station 104. From the loading station 104, the container can be transferred to the automatic transport 105 through mechanism 203. The station 106 can interface with the stocker loading station 103, preferably through a mechanism 206. For example, the stocker loading station 103 can be an EFEM, which is designed to interface with the stocker storage area 102.

FIG. 4 illustrate other exemplary embodiments of the buffer assembly, comprising an additional buffer loading station 104A with the same mechanism 202 interfacing with the buffer stations 101. The same mechanism 202 can service both buffer loading stations 104 and 104A as shown in these figures. Alternatively, a different transfer mechanism can be implemented to service the addition buffer loading station 104A. The additional buffer loading station 104A can be linked to the same automatic transport 105 or to another automatic transport 105A through a same or different transfer mechanism 203A.

Figure 4A:
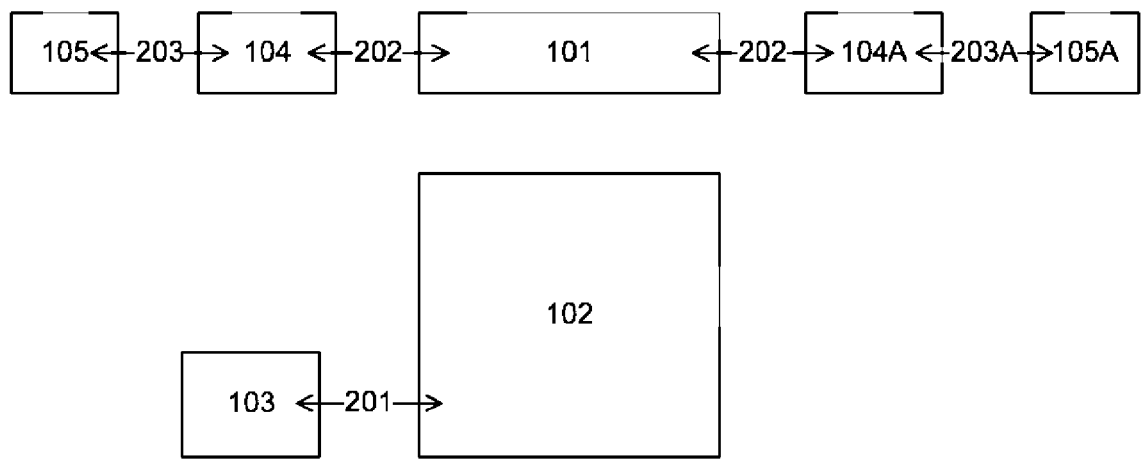

FIG. 4A illustrates two separate automatic transports 105 and 105A, serviced by two buffer loading stations 104 and 104A through two transfer mechanisms 203 and 203A, respectively. The two automatic transports can be located at opposite ends of the buffer assembly, for example, at the front and the back of the stocker. The two automatic transports can be located at two sides of the buffer assembly, for example, at the front and the left (or right) side of the stocker. A same transfer mechanism 202 can be used to service the two buffer loading stations 104 and 104A, transferring containers from the buffer station 101 to the buffer loading stations 104 and 104A.

Figure 4B:
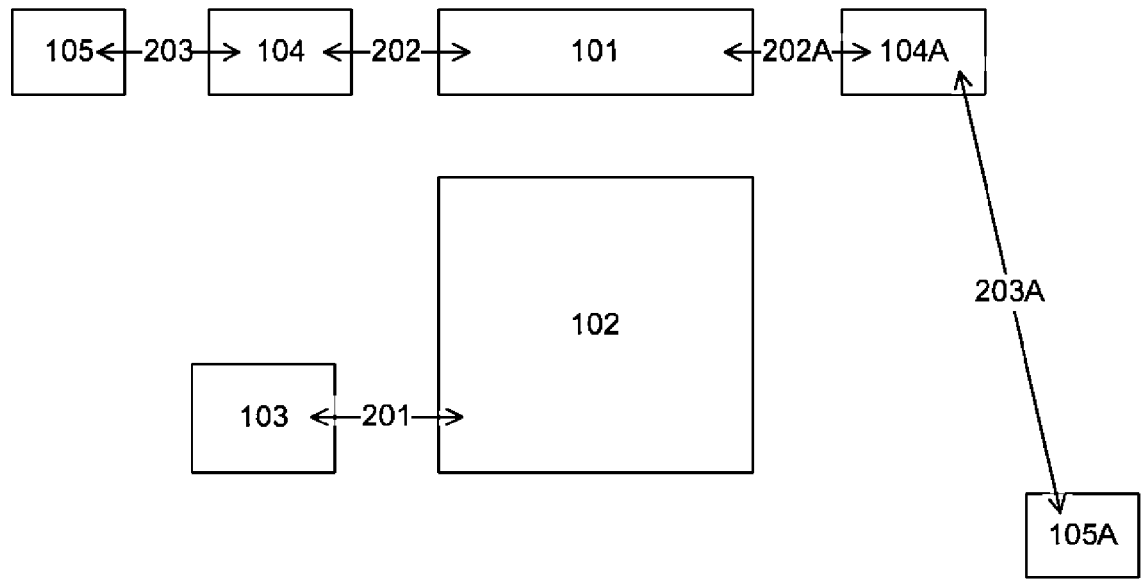

FIG. 4B also illustrates two separate automatic transports 105 and 105A at opposite ends. For example, the transport 105 can be ceiling-based transport and the transport 105A can be floor-based transport. Thus mechanism 203 is shown transferring container at the same height, from the ceiling station 104 to the ceiling transport 105, and mechanism 203A is shown transferring container at the different height, from the ceiling station 104A to the floor transport 105A. Further, the mechanism transferring container from buffer station 101 can be different, for example, mechanism 202 to transfer to buffer loading station 104 and mechanism 202A to transfer to buffer loading station 104A.

Figure 4C:
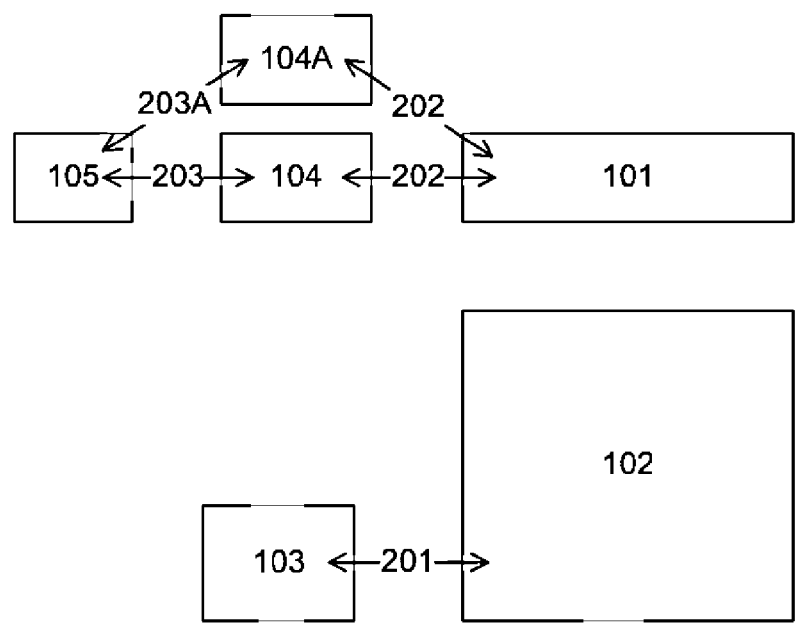

FIG. 4C illustrates two buffer loading stations 104 and 104A servicing the same automatic transport 105 with mechanisms 203 and 203A transferring container from stations 104 and 104A, respectively, to the transport 105. Same mechanism 202 can be used to transfer container from buffer station 101 to the buffer loading stations 104 and 104A.

FIG. 5 illustrate exemplary embodiments of the present buffer assembly having a top buffer transport and a bottom buffer transport. The top/bottom buffer transport comprises buffer station 101/101A with mechanism 202/202A interfacing buffer loading station 104/104A, which interfaces automatic transport 105/105A through mechanism 203/203A. There are also mechanisms to transfer containers from the stocker to the buffer assembly (not shown).

Figure 5A:
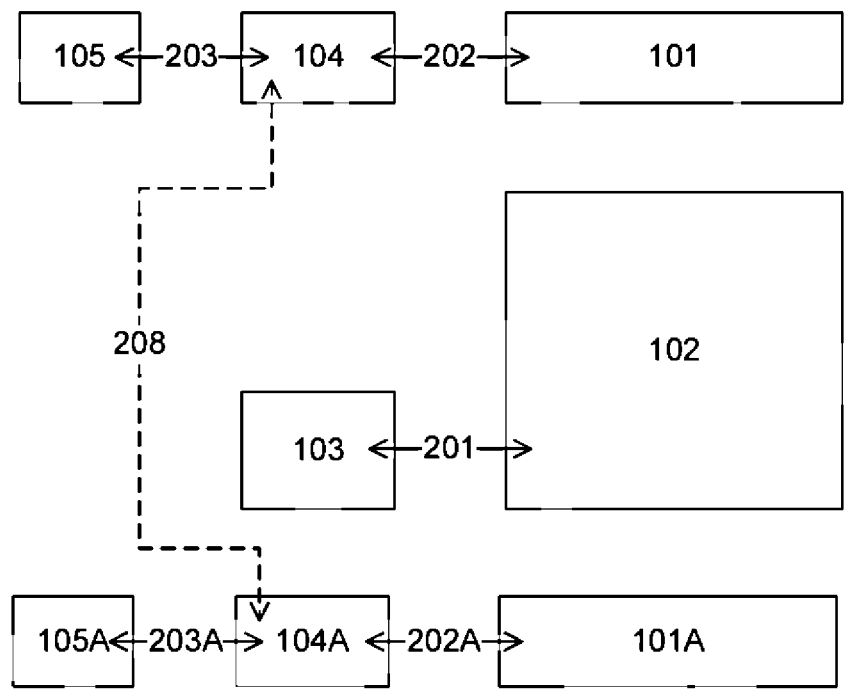
Figure 5B:
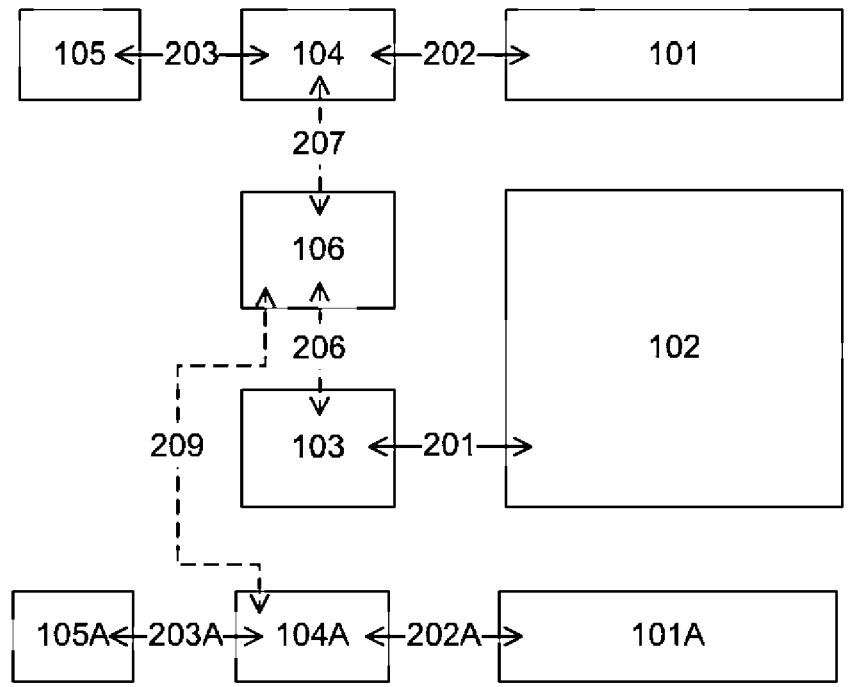

FIG. 5A illustrates a mechanism 208 to transfer containers between the top and bottom buffer loading stations 104 and 104A. FIG. 5B illustrates an additional station 106 such as a MLP to transfer container between the two buffer loading stations 104 and 104A, through mechanisms 207 and 209, respectively. Mechanism 206 is also used to communicate with the stocker loading station 103.

Figure 6A:
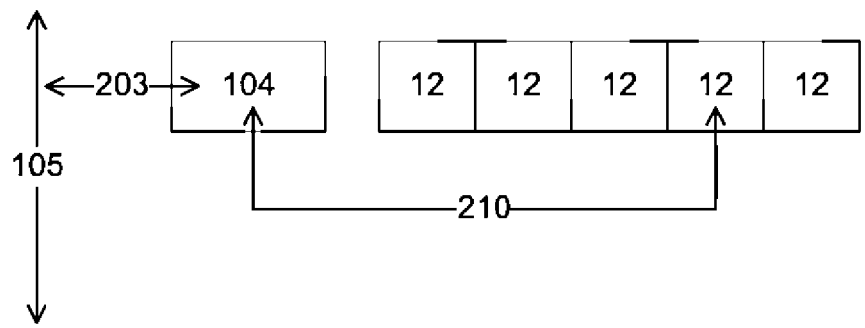
Figure 6B:
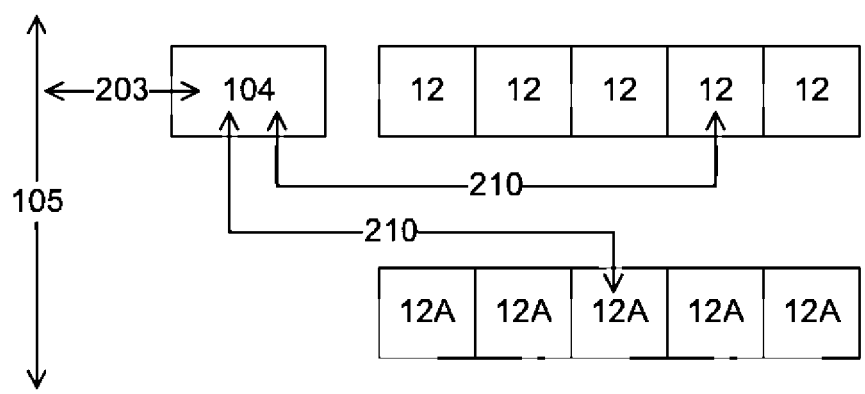
Figure 6C:
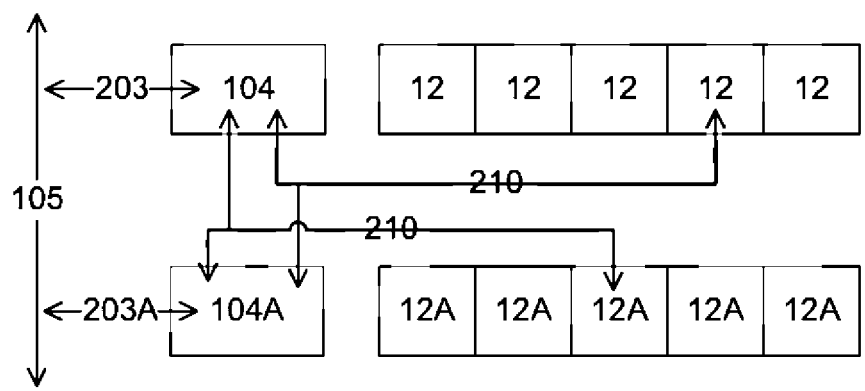

FIG. 6 illustrate the top view of various exemplary embodiments of the buffer assembly interfacing an automatic transport 105. FIG. 6A illustrates a plurality of buffer stations 12 arranged in one row facing the automatic transport 105. Transfer mechanism 210 can transfer any container within the buffer stations 12 to the buffer loading station 104, and then transfer from there to the transport 105 through the mechanism 203. FIG. 6B illustrates additional buffer stations 12A arranged in an opposite and parallel row, sandwiching the transfer mechanism 210. The transfer mechanism 210 can service both buffer stations 12 and 12A, transferring containers to the buffer loading station 104. FIG. 6C illustrates additional buffer loading station 104A having mechanism 203A interfacing the same transport 105. The same mechanism 210 can service the plurality of buffer stations 12 and 12A and the plurality of buffer loading stations 104 and 104A. Alternatively, additional transfer mechanisms can be implemented for servicing different buffer stations and/or buffer loading stations.

These configurations can be for top area of stocker with ceiling-based OHT track, or for bottom area of stocker with floor-based track. These configurations can also be used for front, back or left/right side with appropriate modifications. In FIG. 6C, the buffer assembly comprises two rows of buffer stations 12 and 12A, facing the clean room area, with a middle row for transfer. With two row buffers, access to the buffer stations, meaning the movement of the container, can be in the same height level, thus the height of the buffer assembly can be about the height of the container. Thus two row buffer assembly provides small clean room area together with small height. An OHT track 105 provides an OHT vehicle running at the front (or back) of the stocker. The first two locations in the buffer area can be OHT stations (or buffer loading station) 104, for interfacing with the OHT track. There can be two OHT stations 104 and 104A, providing twice the throughput from the OHT vehicle to the stocker. Alternatively, there can be only one OHT station 104, with the other station 104A being a buffer station 12. The OHT vehicle carries a container along the OHT track 105, stops by the OHT station 104/104A. A transfer mechanism 203/203A transfers the container from the OHT vehicle to the OHT station 104/104A, respectively. From the OHT station 104/104A, the container can be transferred to the buffer stations 12/12A, or can be loaded to the loading station (MLP or EFEM) of the stocker (not shown).

Figure 7:
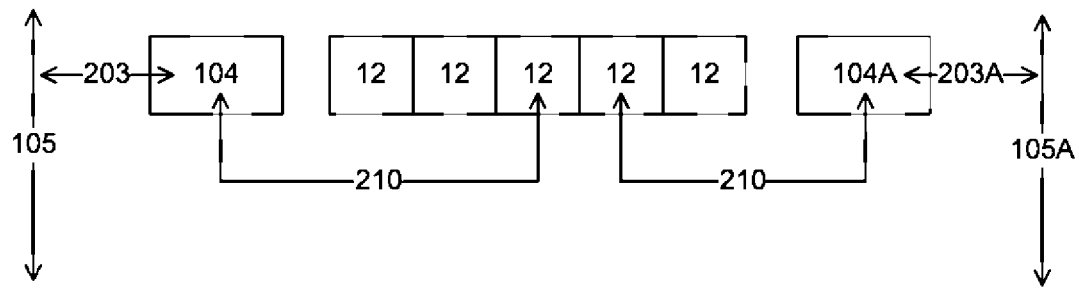

The buffer stations can interface more than one automatic transport such as OHT tracks. FIG. 7 illustrates a top view of an exemplary buffer assembly having one row of buffer stations 12 interfacing two automatic transports 105 and 105A. Same or different mechanism 210 can transfer containers from any buffer station 12 to any buffer loading station 104 or 104A. Separate mechanisms 203 and 203A are shown to transfer containers from buffer loading station 104 and 104A to transports 105 and 105A.

FIG. 8 illustrate top views of exemplary buffer assembly configurations where there are two transports, either intersecting each other or in parallel. Other configurations are also possible, such as more than two transports. The buffer assembly comprises two rows 12 and 12A of buffer stations, arranged in parallel with a middle transfer mechanism. The number of buffer loading stations can be different, for example, there can be two, three or four buffer loading stations.

Figure 8A:
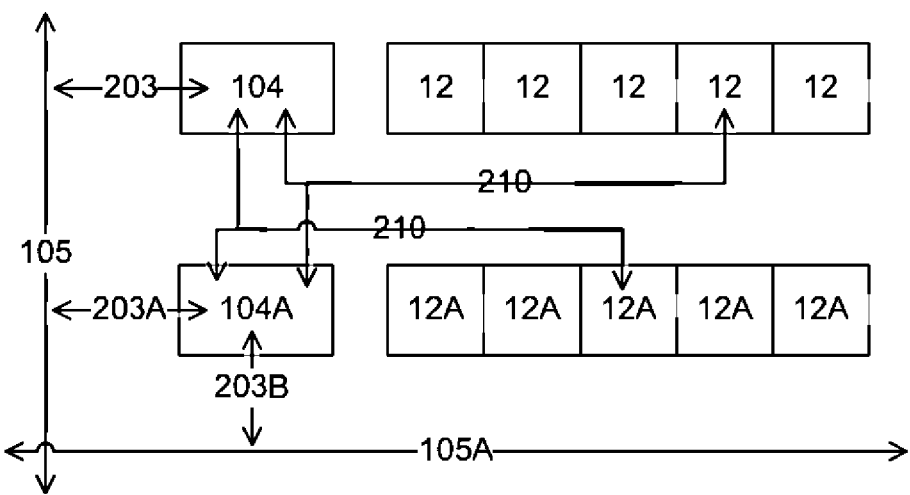

FIG. 8A illustrates a buffer assembly configuration comprising two buffer loading stations 104 and 104A located at the end of the buffer stations, together with two intersecting transports 105 and 105A. Buffer loading station 104 comprises mechanism 203 to transfer container to the transport 105. Buffer loading station 104A comprises mechanism 203A to transfer container to the transport 105, and mechanism 203B to transfer container to the transport 105A.

Figure 8B:
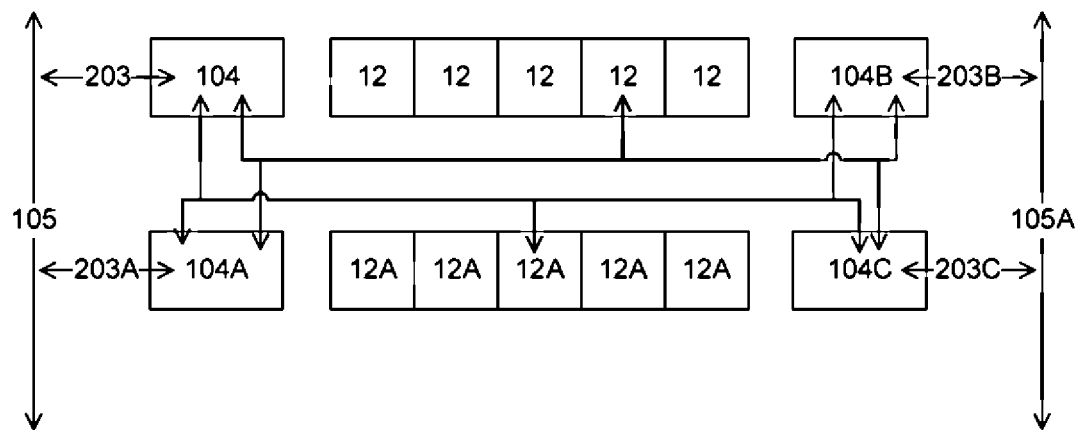

FIG. 8B illustrates a buffer assembly configuration comprising four buffer loading stations 104, 104A, 104B, and 104C located at two ends of the buffer stations, together with two parallel transports 105 and 105A. Each buffer loading station 104/104A/104B/104C comprises mechanism 203/203A/203B/203C, respectively, to transfer container to the transport 105/105A.

Figure 8C:
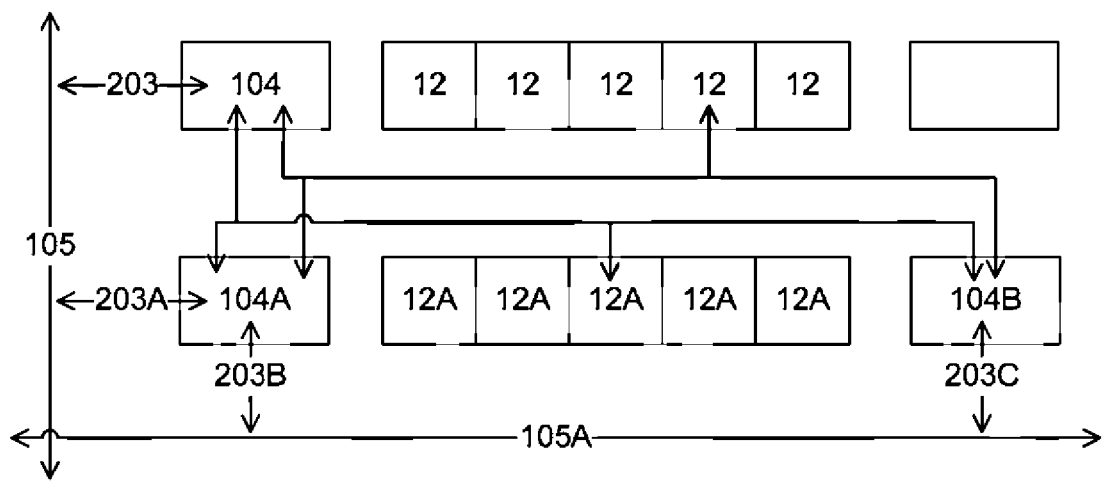

FIG. 8C illustrates a buffer assembly configuration comprising three buffer loading stations 104, 104A, and 104B located at two ends of the buffer stations, together with two intersecting transports 105 and 105A. Buffer loading station 104/104B comprises mechanism 203/203C to transfer container to the transport 105/105A, respectively. Buffer loading station 104A comprises mechanism 203A to transfer container to the transport 105, and mechanism 203B to transfer container to the transport 105A. A same mechanism can be used to service the buffer stations and the buffer loading stations. The empty station at the end of the buffer row can be used for buffer station.

Figure 9:
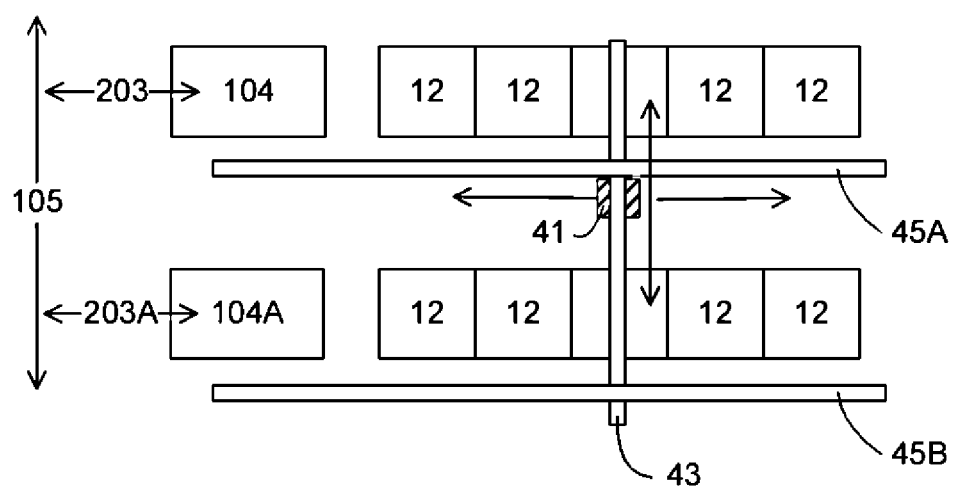
FIG. 9 illustrates an exemplary buffer configuration with a linear robotic mechanism to transfer the containers from the buffer stations to the buffer loading stations.

FIG. 9 illustrates an exemplary buffer configuration with a linear robotic mechanism to transfer the containers from the buffer stations 12 to the buffer loading stations 104/104A. Two stationary parallel tracks 45A and 45B establish a horizontal movement for a moving vertical track 43. A buffer vehicle 41 traveling on the vertical track 43 can retrieve a container from a buffer station 12. The container is transferred from the buffer station 12, traveled to the middle row along the vertical track 43. The vertical track 43 moves along the horizontal tracks 45A and 45B to reach the buffer loading station 104/104A. At the buffer loading station 104/104A, the buffer vehicle 41 moves along the vertical track 43 to place the container at the buffer loading station 104/104A. Moving container from the buffer loading station 104/104A to the buffer stations 12 can be accomplished by a reversing of direction. From the buffer loading stations 104/104A, the container can be transfer to the OHT track 105 through the transfer mechanisms 203/203A. This illustrates an exemplary configuration of a buffer mechanism to transfer containers between the buffer stations 12 and the buffer loading stations 104/104A. Other mechanisms can also be implemented, for example, a xy table mechanism or a robotic arm servicing the buffer assembly area.

The two-row configuration of the buffer area provides random access of the buffer stations with minimum height. Additional rows would require doubling the height to accommodate the back rows. If additional buffer stations are needed, double stack configuration of two-row buffer can be implemented.

Figure 10:
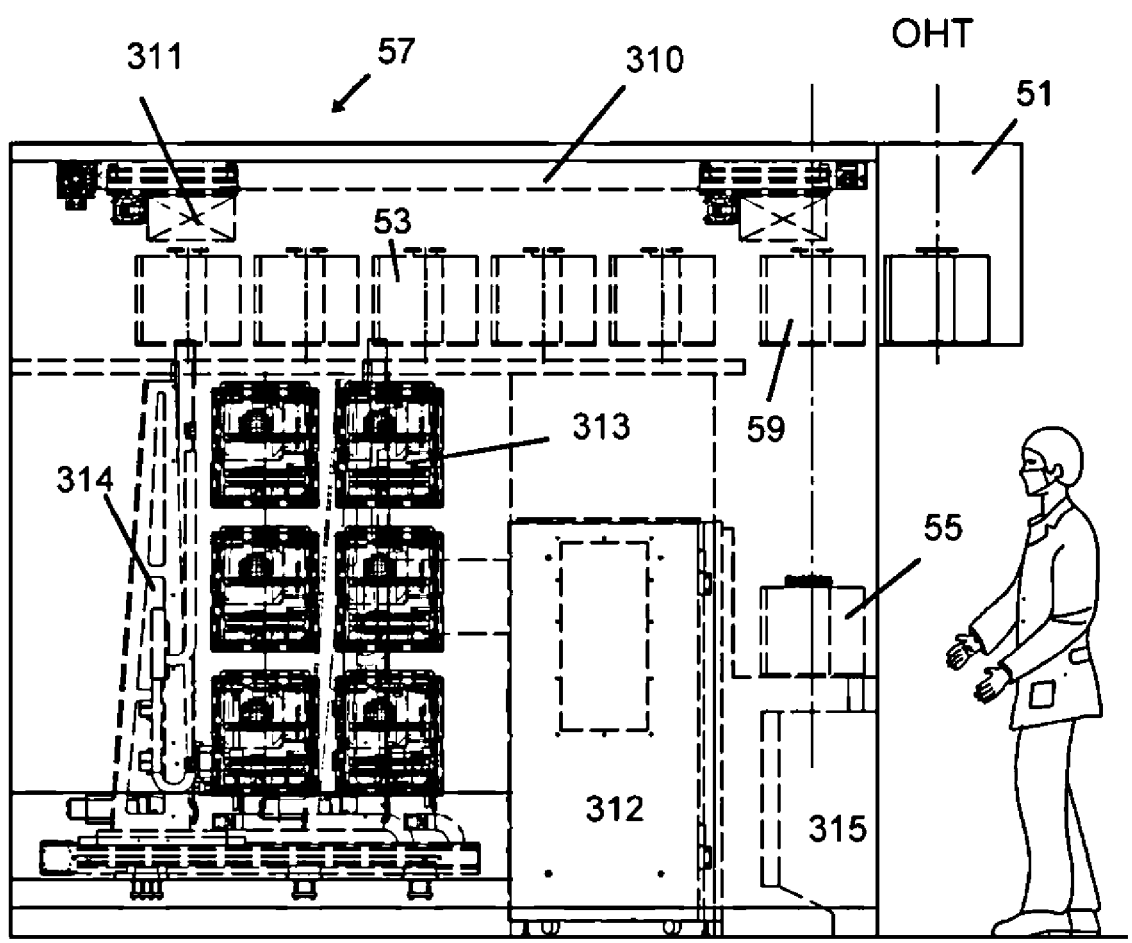
FIG. 10 illustrates an exemplary configuration of the automatic buffer incorporated in the top section of the stocker.

FIG. 10 illustrates an exemplary configuration of the automatic buffer incorporated in the top section of the stocker. The ceiling-based OHT track 51 is typically part of the facility, and the stocker 57 having the buffer loading OHT station 59 interfacing the OHT track 51. A number of buffer stations 53 storing containers ready to be transferred to the buffer loading station 59. Linear guide transfer mechanism 310 drives an OHT vehicle 311 to transport containers from the buffer stations 53 to the buffer loading station 59. Also shown is the stocker loading station 55 for loading the wafers to the stocker and/or to the buffer loading station 59. The stocker loading station 55 can receive the container from the OHT station 59, from a MLP station, or from the operator. Multiple stocker loading stations can be installed with optional transfer mechanism between them, especially from the OHT loader and the MLP station. Elevator mechanism 315 can transport container in loading station 55 to the buffer loading station 59. Robotic mechanism 312 can transfer substrates or wafers from the container in loading station 55, to be stored bare in compartments 313 within the stocker storage area. Inner robotic 314 can handle bare substrates or wafers within the storage area.

In exemplary embodiments, the present stocker discloses scalable storage area with two opposite walls of storage shelves and a middle robotic mechanism servicing the shelves. The length of the wall can be extended to provide more storage area, together with an extended track for the robot mechanism. Clean room space is expensive, with the width even more expensive than the length due to higher cleanliness requirements facing the front side. Thus exemplary stocker according to the present invention provides optimum width with a flexible and scalable length.

The buffer can include a plurality of shelves, each shelf having an upper surface capable of supporting a carrier box. Shelves are designed to have minimum space, thus may be vertically spaced from each other a distance sufficient to support a carrier box, and to allow a robot to enter to transport the carrier box. In one embodiment, the shelves are aligned in a plurality of rows and columns. However the shelves may be provided in various configurations. In one aspect, a robot is provided with ability to move in an X-Y Cartesian plane, to access a plurality of shelves for either buffer or loader.

Figure 11A:
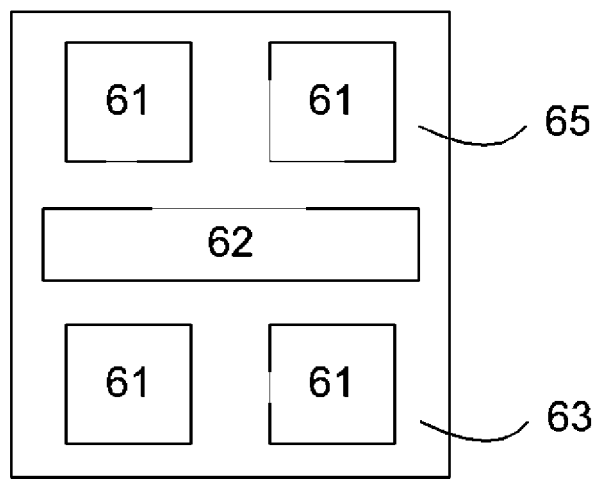
FIG. 11A illustrates a top view of an exemplary stocker storage area.

FIG. 11A illustrates a top view of an exemplary stocker storage area. The storage area comprises 2 opposite walls 63 and 65 of shelves 61. Each wall comprises 2 columns of shelves, serviceable by a robotic mechanism traveling in the center section 62. The robotic mechanism travels in a track to address different columns of shelves. The robotic mechanism further comprises a vertical movement to address different rows of shelves stacked in the vertical direction. The robotic mechanism further comprises a wafer handling arm to pick up or placing the wafers in the shelves.

Figure 11B:
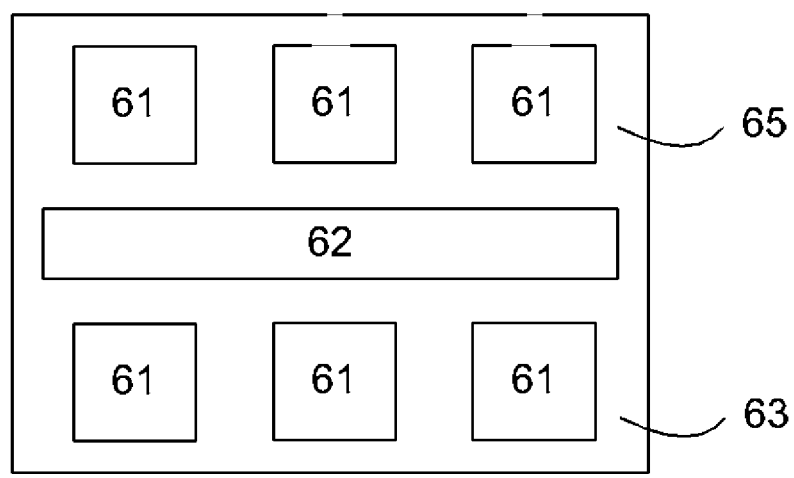
FIG. 11B illustrates an exemplary extension of the scalable stocker.

FIG. 11B illustrates an exemplary extension of the scalable stocker. The stocker storage area comprises 3 columns of shelves (instead of 2). The track of the robotic mechanism is also extended to accommodate the new column of shelves. Since the length of the stocker typically extends to the chase area of the clean room, extension does not occupy more valuable clean room space.

In exemplary embodiments, each wall of the storage area comprises one layer of shelves. Thus the width of the stocker can be minimized for twice the width of the shelves plus the width of the robotic mechanism. In an embodiment, the wafers are stored in close spacing to increase the storage density. Further, the wafers can be stored vertically for minimum contact at the side edges.

Figure 12:
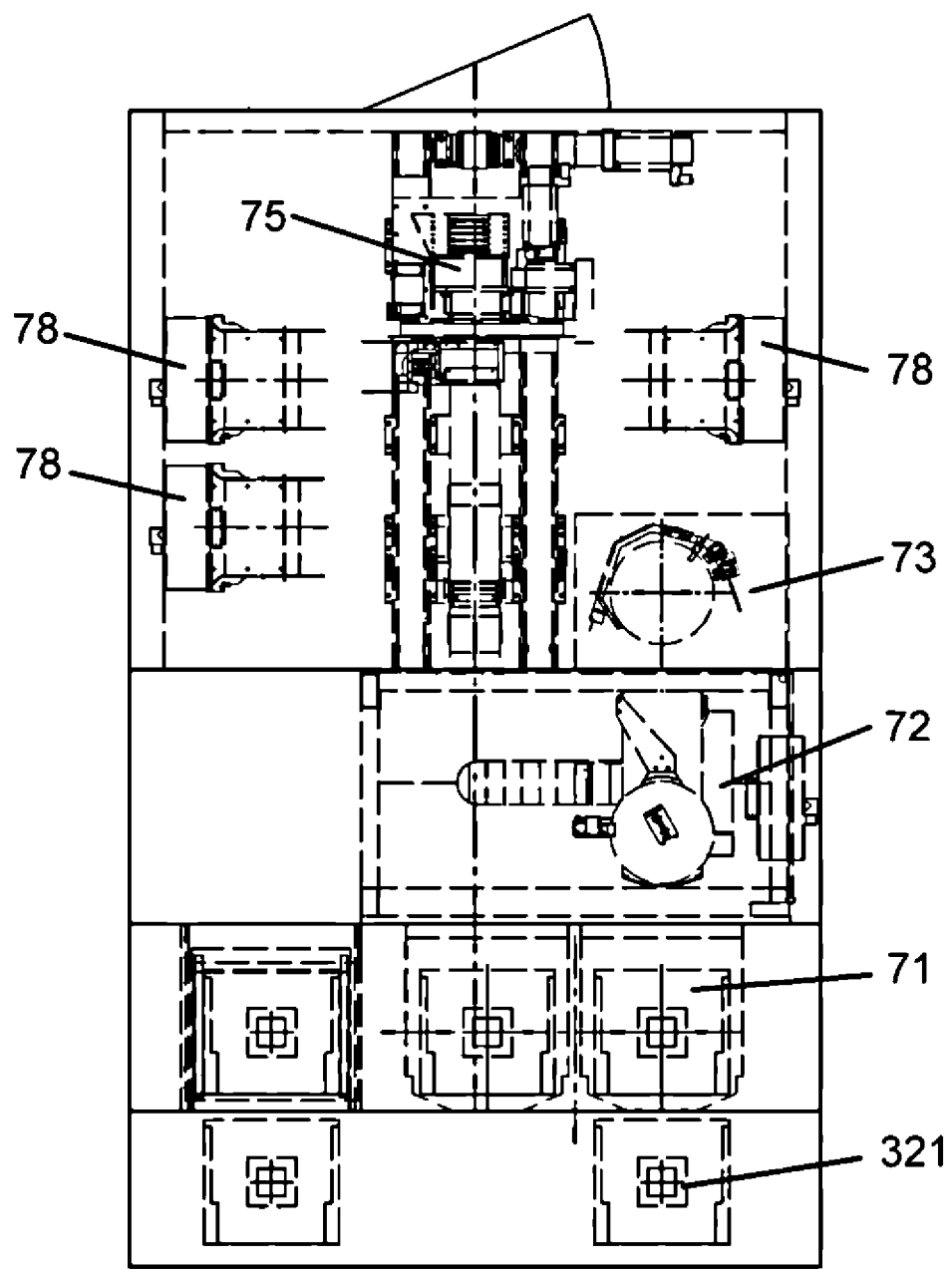
FIG. 12 illustrates a top view of an exemplary stocker utilizing the scalable storage area.

FIG. 12 illustrates a top view of an exemplary stocker utilizing the scalable storage area. The stocker comprises loading stations 71, either for manual loading wafers or for automatic loading using automatic guide vehicle such as OHT track. The configuration shown comprises three loading stations, with two stations for EFEM and one station for MLP. The EFEM stations allow the operator to load containers to the stocker. The MLP station can transfer container to the EFEM and/or the buffer loading station, located on top of the stocker. Also shown is the OHT track 321 for transporting containers from the buffer loading station.

Next to the loading stations 71 is the robotic mechanism 72, for transferring wafers from the containers within the loading stations 71. A drop station 73 interfacing the robotic mechanism 72 for receiving the wafer, and to change the orientation. The wafers are typically stored horizontally in the containers (such as FOUP), and then changed orientation to be stored bare and vertically in the compartments 78 within the stocker storage area. Drop station can be designed to allow the wafer to be picked up from the bottom and from the side. Robotic mechanism 75 can receive the wafers from the drop station 73 and store them in the storage compartments 78. The wafers are preferably stored in a vertical direction with small pitch for high density. Robotic mechanism 75 travels between the compartments 78 and the drop station 73 to access the stored wafers.

Figure 13:
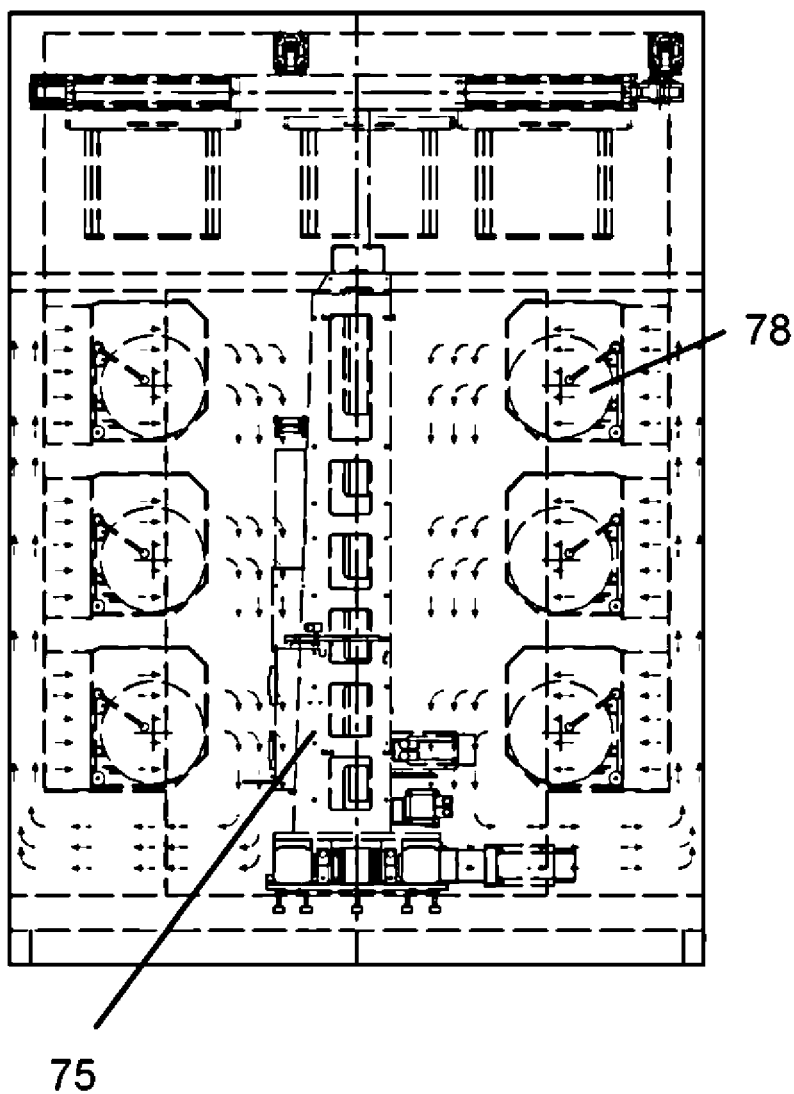
FIG. 13 illustrates a cross section of an exemplary stocker utilizing the scalable storage area.

FIG. 13 illustrates a cross section of an exemplary stocker utilizing the scalable storage area. The stocker comprises two opposite walls of storage shelves 78, storing the wafers in vertical direction. A robotic mechanism 75 can service the shelves, retrieving and placing the wafers to the shelves. OHT station and track are shown on top of the stocker. The stocker possesses flow dynamic to minimize particulate contamination. Flow across the wafers from the wall passes through the wafer to the center robotic mechanism to the floor, and recirculates through the stocker wall back to the wafer compartment. The flow passes the wafers only once to ensure cleanliness.

In exemplary embodiments, the present invention discloses a stocker utilizing a combination of automatic buffer and scalable storage area. The exemplary stocker comprises two walls of storage shelves in the storage area and two rows of buffer stations on the top (or bottom) of the stocker. The middle area is to accommodate a robotic mechanism, one to service the storage shelves, and one to service the buffer stations.

The stocker further comprises a stocker loading station to transfer wafers from a container to the storage area. The stocker also comprises an automatic handling station, such as an OHT loading station, for transferring the container to the OHT track. There are multiple separate stocker loading station for interfacing with the stocker (EFEM), and an OHT loading station for interfacing with OHT track. There can also be transfer mechanism for moving containers between the stocker loading station and the OHT loading station.

The loading station can comprise an EFEM station for handling wafer containers such as FOUP or SMIF. The loading station can be handled by an operator, thus providing manual handling of the wafer containers.

The loading station can comprise an automatic loading station, such as a MLP (Mobile Launch Platform), designed for accepting containers from an automatic handling system, such as OHT track, together with a transfer mechanism between these stations.

The stocker according to an exemplary embodiment of the present invention is designed for storing contamination-sensitive wafer shape articles such as semiconductor wafers, and reticles. The stocker designed is particularly configured for space-saving storage and flexible handling. The stocker, in particular, is well suitable for storing a large number of 300 mm or larger wafer on a small storage space under clean conditions.

In an embodiment, the stocker provides that the articles, such as semiconductor wafers, can be stored openly in the clean storage area, together with the robot handling assembly. The robot handling unit thus can access very fast the individual articles and to pick up and place them in carrier boxes. The open storage concept can provide high density with small footprint storage.

The open storage can be partitioned into compartments to reduce the risk of cross contamination. The compartments can include storage containers, fastened to carrier racks. The stationary of the carrier racks, the storage containers, the compartments and the articles prevent particles generated from motions, thus substantially reducing the risk of particles generated by abrasion, movement and cross contamination air flow.

The storage containers are preferably shaped as an open, box-like container, where the robot handling unit can be adapted optimally to inserting and taking articles out of the storage containers. In a preferred embodiment, the containers are designed for highly dense storage of articles, for example semiconductor wafer with a pitch distance of less than 5 mm, preferably about 2.5 mm or less. The storage containers are arranged in a shelving configuration surrounding the robot handling unit, and preferably approximately circular. The storage containers can be arranged in an x-y array, with the shelves openings facing a robotic mechanism for transferring the articles. The stationary stocker comprises a plurality of vertically and horizontally spaced shelves each for storing a plurality of articles. The shelves can also designed for storing a plurality of containers where the articles are stored within.

This configuration can provide space-saving arrangement and at the same time high storage capacity. In addition a very fast accessing of stored articles can be possible in this configuration.

The robot handling unit includes vertical movement to access the vertical storage containers. The stocker can also include a second handling unit for transferring the articles into or from the containers. The stocker can include a blower for producing a continuous clean gas flow toward the containers, and preferably blowing contamination efficiently downward.

Figure 14:
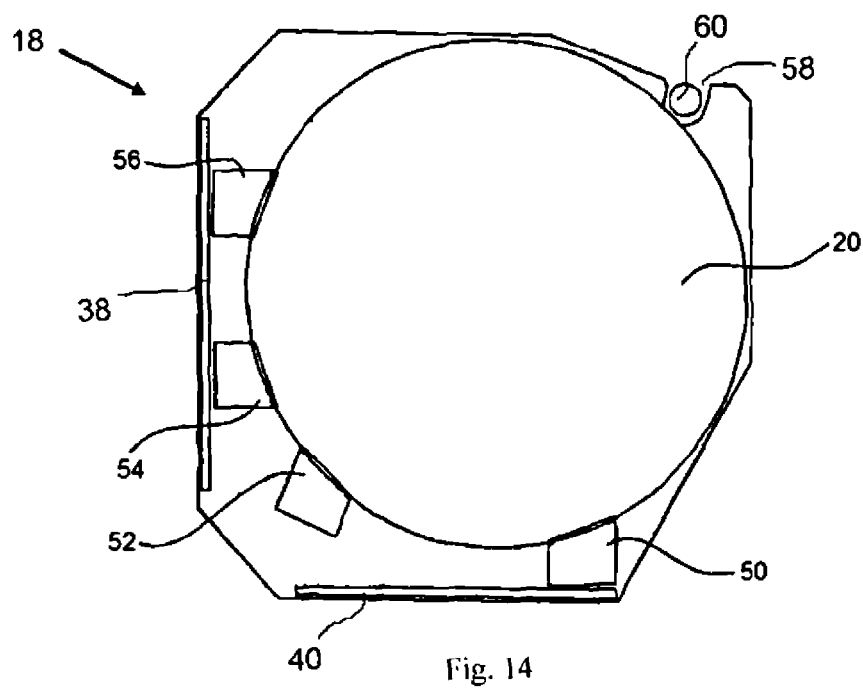
FIGS. 14 and 15 show different views of an exemplary embodiment of a container.
Figure 15:
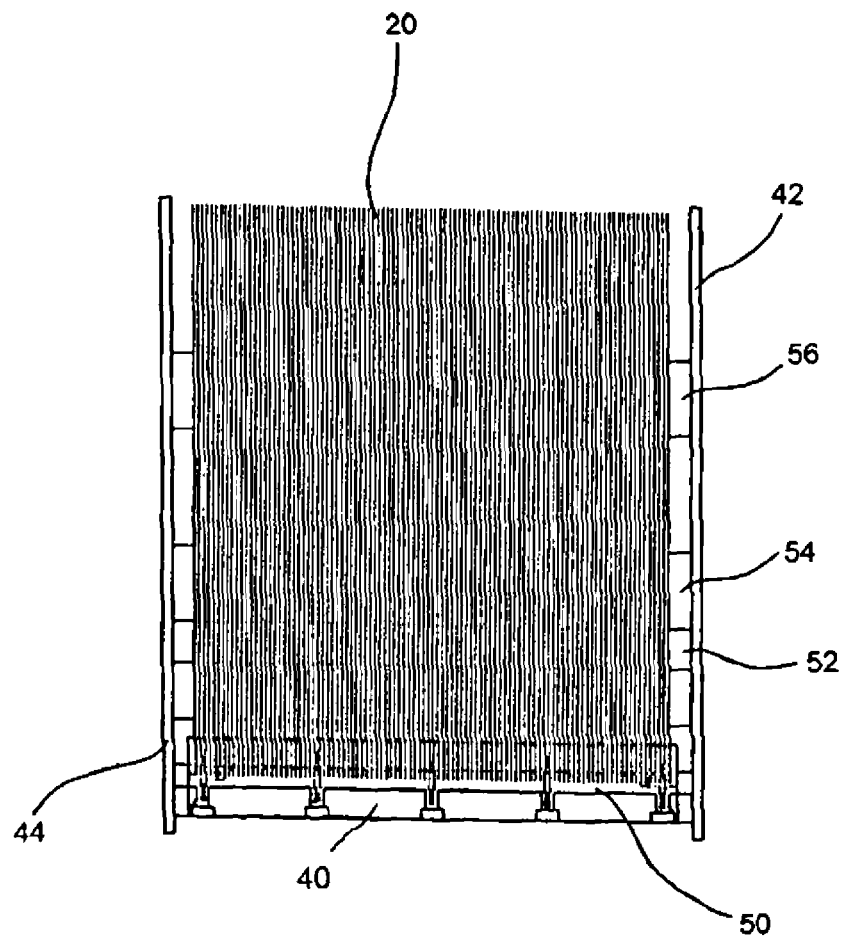

FIGS. 14 and 15 show an exemplary embodiment of a container 18, which includes a rear wall 38, a bottom wall 40 and two side panels 42, 44. The rear wall 38 and the bottom wall 40 preferably provide an opening for releasing clean air flow diagonally across the wafer 20. The air flow between the individual wafers 20 passes through and ensures that any existing particles and foreign matter are removed diagonally downward from the container 18.

Within the container 18 four comblike components with splits 50, 52, 54, 56 are arranged. The split 50-56 are arranged to hold a wafer by its down and back side to permit the removal of the wafer with the robot handling unit 14.

At the upper corner area, there exists a recess 58 to insert a retainer 60. The retainer 60 is designed to hold the wafers in place during movement of the container 18. Each container 18 may have a handle (not shown), which is connected with the retainer 60, so that a withdrawal of the container 18 is only possible if the retainer 60 is inserted in the recess 58.

Figure 16:
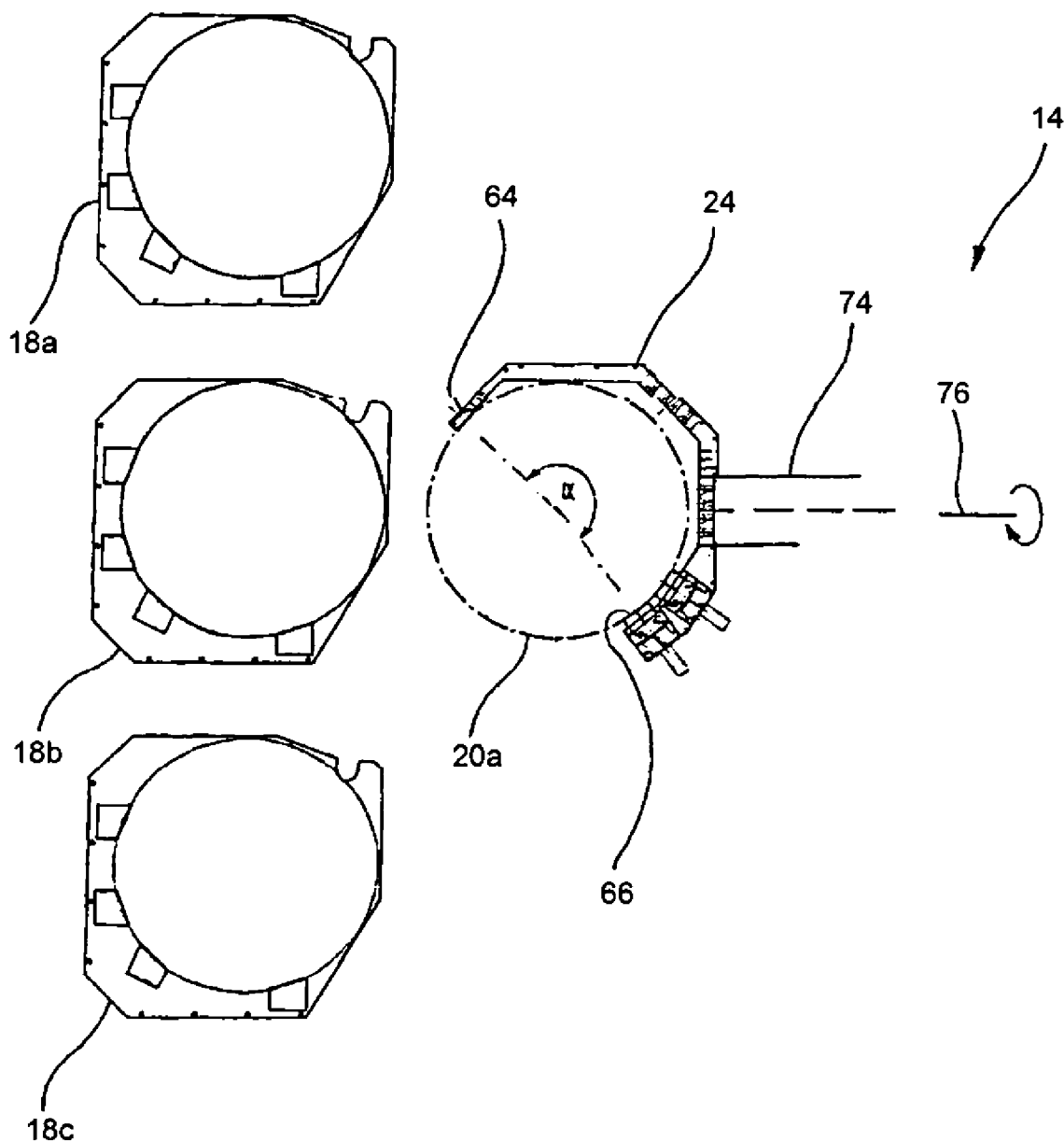
FIG. 16 shows an exemplary robot handling arm according to the present invention.

FIG. 16 shows an exemplary robot handling arm 14 according to the present invention, comprising a gripper arm 24, where a wafer 20a can be seized at the edges in a vertical position. The grip arm 24 surrounds the wafer 20a at its outer circumference in an exemplary C-shaped. Two grip elements 64 and 66 are arranged at the free ends of the grip arm 24. The grip arm 24 surrounds the wafer 20a along a circular arc "alpha" of more than 180°. The grip elements 64, 66 can hold the wafer 20a therefore without firm wedging and essentially alone due to gravity. For the pick up and placement of a wafer 20a in a carrier box 18 such as carrier box 18a, 18b or 18c, the grip elements 64, 66 can be opened. In this figure, only the grip element 66 is mobile.

The gripper 24 is arranged at the free ends of an arm segment 74. The arm segment 74 can be swiveling around an axle 76, which lies coaxially to a leg of the arm segment 74, where the gripper 24 is located. This arrangement makes it possible to take and by a 90° rotation around the axle 76, bringing a wafer 20a into a vertical position out of a horizontal position from the drop station.

The stocker can provide random access to the stored wafer, thus can eliminate the need for a sorter. In particular, the robot handling unit 14 is capable of selecting wafers from arbitrary containers 18 into a FOUP. The stocker thus can be integrated with a FOUP front end loader. Due to the vertical storage and the associated high density storage arrangement of the wafers, the stocker can achieve high storage capacity with small footprint. The storage of the individual wafers in open, separate, box shaped container ensures that cross contamination between different wafers is difficult despite the open storage configuration.

The stocker storage system is designed so that the storage area is free of movement components, circuitry, and other contaminant generating parts. Further, the air flow is filtered before entering the storage area, and the storage area is designed to have a laminar air flow on the surfaces of each workpiece, thus ensuring that there is no upstream contamination generation source. The clean air flow is then passing the workpieces toward the robot handling unit, which is located in the center of the storage area, downstream of the clean air flow. Thus the movement of the robot handling unit does not contribute to any particle generation within the clean air flow path over the workpieces. Other components associated with the operation of the stocker system are located external to the storage unit and downstream of the air flow over the workpieces.

The clean air delivery units can also deliver uniform clean air flow through the workpieces and system after being filtered. The storage area is designed to minimize or eliminate non-uniform, turbulent, or dead space with little or no airflow with symmetric volumes, gradually changes to the airflow direction, singularly airflow directions, and controlled venting. The exhaust venting rate can also be controlled to achieve a positive internal pressure for minimizing contamination migration into the storage area.

A series of blowers can circulate clean air horizontally through the rack, through the slots of the racks, and over the workpieces. The blowers can be positioned in the upper or lower areas, and then air is drawn downwardly or upwardly into an enclosure before traveling horizontally into the workpieces. The air flow then exits vertically downward adjacent to the racks. Some of the air can exit near the bottom of storage area through closeable louvers and some of the air can be recirculated back.

The horizontal flow through the workpieces prevents particles from coming to rest on the workpieces and the workpiece rack, and the vertically downward air flow removes particles from the stocker storage area. The horizontal air flow is preferably flowing inward, from the outside to the center of the stocker storage area. The outside is normally the enclosure walls, thus is without any particle generation. The robot handling system is located in the center of the stocker, thus is positioned downstream of the air flow from the workpieces, and preventing particles from damaging the workpieces.

With this flow configuration, the air flow only passes by the workpieces once. Thus any particles picked up by the air flow through a workpiece do not pass through another workpiece to prevent redeposition. The clean air from the fan and filter unit only passes though a single workpiece and then exits through a bottom of the center robot handling assembly. Moreover, with the robot handling in the center area, the particulates are most likely generated where the contacts are, such as where the robot arm contacts the workpieces, or where the workpieces contact the slots. The air system through the surfaces of the workpieces blows the generated particles away from, and not towards, the workpieces in the storage area.

What is claimed is:

1. A buffer assembly interfacing a substrate equipment, the buffer assembly comprising:
    a transport buffer, the transport buffer comprising:
        one or more buffer stations for storing one or more substrate containers containing substrates; and
        a buffer loading station adapted for holding a substrate container;
    a buffer transfer mechanism to transfer a substrate container between the buffer loading station and the buffer stations; and
    an interface mechanism adapted for transferring a substrate container between the transport buffer and an equipment loading station of the substrate equipment,
    wherein the equipment loading station is configured to accept a substrate container transferring from the interface mechanism,
    wherein the equipment loading station is further configured to directly accept a substrate container loaded manually by an operator without an intermediate transfer of the substrate container for transferring substrates or substrate container to the substrate equipment.

2. A buffer assembly as in claim 1 wherein the interface mechanism is adapted to transfer a substrate container between the equipment loading station and the buffer loading station.

3. A buffer assembly as in claim 1 wherein the interface mechanism is adapted to transfer a substrate container between the equipment loading station and the buffer stations.

4. A buffer assembly as in claim 1 wherein the substrate equipment is a bare substrate equipment and wherein the substrates within the substrate container from the equipment loading station are removed from the substrate container and placed bare in the substrate equipment.

5. A buffer assembly as in claim 1 further comprising a mechanism to transfer a substrate container between the buffer loading station and an automatic transport.

6. A buffer assembly as in claim 1 wherein the buffer stations are ceiling-based, floor-based, or a combination thereof.

7. A buffer assembly as in claim 1 wherein the transport buffer comprises a plurality of buffer loading stations interfacing with one or more automatic transports.

8. An improvement to a substrate equipment comprising a buffer assembly for auto transport, the buffer assembly interfacing the substrate equipment and comprising:
    a transport buffer, the transport buffer comprising:
        one or more buffer stations for storing one or more substrate containers containing substrates; and
        a buffer loading station adapted for holding a substrate container;
    a buffer transfer mechanism to transfer a substrate container between the buffer loading station and the buffer stations; and
    an interface mechanism adapted for transferring a substrate container between the transport buffer and an equipment loading station of the substrate equipment,
    wherein the equipment loading station is configured to accept a substrate container transferring from the interface mechanism,
    wherein the equipment loading station is further configured to directly accept a substrate container loaded manually by an operator for transferring substrates or substrate container to the substrate equipment.

9. An improvement as in claim 8 further comprising a mechanism to transfer a substrate container between the buffer loading station and the automatic transport.

10. A substrate stocker comprising:
    a stocker storage for storing substrates;
    a stocker loading station adapted for holding a substrate container, wherein the stocker loading station is configured to directly accept a substrate container loaded manually by an operator without an intermediate transfer of the substrate container;

a stocker loading mechanism adapted for transferring substrates between the stocker loading station and the stocker storage;

a transport buffer comprising:
  one or more buffer stations for storing one or more substrate containers containing substrates; and
  a buffer loading station adapted for holding a substrate container;

a buffer transfer mechanism to transfer a substrate container between the buffer loading station and the buffer stations; and an interface mechanism adapted for transferring a substrate container between the stocker loading station and the transport buffer.

11. A stocker as in claim 10 further comprising a drop station interfacing the stocker loading station and the stocker storage, wherein the drop station is adapted to allow the substrate to be picked up either at a bottom or at an edge of the substrate.

12. A stocker as in claim 10 further comprising an inner robotic mechanism interfacing the drop station and the stocker storage.

13. A stocker as in claim 10 wherein the substrates are stored in a vertical configuration with a pitch less than 2.5 mm in the stocker storage.

14. A stocker as in claim 10 wherein the interface mechanism is adapted to transfer substrate containers between the stocker loading station and the buffer loading station.

15. A stocker as in claim 10 further comprising a mechanism to transfer containers between the buffer loading station and the automatic transport.

16. A stocker as in claim 10 wherein the buffer stations are ceiling-based, floor-based, or a combination thereof.

17. A stocker as in claim 10 wherein the buffer stations are arranged in a two-row buffer station array with a linear container transfer mechanism in a middle of the two-row buffer station array wherein each row of the two-row buffer station array comprises a plurality of storage locations.

18. A stocker as in claim 10 wherein the stocker storage is a bare substrate stocker storage and wherein the stocker loading mechanism receives bare substrates from the bare substrate stocker storage for placing in a substrate container to be transferred to the stocker loading station.

19. A stocker as in claim 10 wherein the stocker loading station is configured to accept a substrate container from an automatic transport.

20. A stocker as in claim 10 further comprising a mobile launch platform, wherein the mobile launch platform is configured to directly accept a substrate container loaded manually by an operator without an intermediate transfer of the substrate container, wherein the mobile launch platform is configured to accept a substrate container from an automatic transport, wherein the stocker loading station is configured to accept a substrate container transferred from the mobile launch platform.

* * * * *